(12) United States Patent
Park et al.

(10) Patent No.: US 8,736,159 B2
(45) Date of Patent: May 27, 2014

(54) ORGANIC LIGHT EMITTING DIODE DISPLAY DEVICE

(75) Inventors: Eunjung Park, Daegu (KR); Sunghoon Choi, Gyeonggi-do (KR); Sangdae Kim, Daegu (KR)

(73) Assignee: LG Display Co., Ltd., Seoul (KR)

( * ) Notice: Subject to any disclaimer, the term of this patent is extended or adjusted under 35 U.S.C. 154(b) by 358 days.

(21) Appl. No.: 12/627,580

(22) Filed: Nov. 30, 2009

(65) Prior Publication Data

US 2011/0031876 A1    Feb. 10, 2011

(30) Foreign Application Priority Data

Aug. 6, 2009   (KR) .................. 10-2009-0072438

(51) Int. Cl.
*H01J 1/62*       (2006.01)
*H01J 63/04*    (2006.01)

(52) U.S. Cl.
USPC .......................................... 313/506; 313/504

(58) Field of Classification Search
USPC .................................................. 313/498–512
See application file for complete search history.

(56) References Cited

U.S. PATENT DOCUMENTS

2007/0102737 A1*   5/2007   Kashiwabara et al. ........ 257/291

FOREIGN PATENT DOCUMENTS

KR      10-2008-0053646       1/2004

\* cited by examiner

*Primary Examiner* — Anh Mai
*Assistant Examiner* — Zachary J Snyder
(74) *Attorney, Agent, or Firm* — Morgan, Lewis & Bockius LLP

(57) ABSTRACT

An organic light emitting diode (OLED) display device is provided. The OLED display device according to an embodiment of this document may comprise a substrate and a number of unit pixels placed over the substrate. Each of the unit pixels comprises emission layers each interposed between first electrodes and a second electrode. The unit pixel further comprises three subpixels emitting respective pieces of light of red, green, and blue. Each of two or less of the three subpixels may comprise a translucent reflection layer.

10 Claims, 8 Drawing Sheets

ORGANIC LIGHT EMITTING DIODE DISPLAY DEVICE

This application claims the benefit of Korean Patent Application No. 10-2009-0072438 filed on August 6, which is hereby incorporated by reference.

BACKGROUND

1. Field

This document relates to an organic light emitting diode (OLED) display device and, more particularly, to an OLED display device which is capable of improving the color purity and luminous efficiency using translucent reflection layers.

2. Related Art

With the development of multimedia, a flat panel display (FPD) is recently gaining its importance. In line with this trend, several flat type displays, such as a liquid crystal display (LCD), a plasma display panel (PDP), a field emission display (FED), and an organic light emitting device, are being put to practical use.

In particular, the organic light emitting device is an active matrix type which has a high-speed response speed (i.e., a response speed of 1 ms or less) and low consumption power. The organic light emitting device is also advantageous as a motion image display medium irrespective of the size of the device because it has no problem in the viewing angle. Further, the organic light emitting device is being in the spotlight as the next-generation FPD because it can be fabricated at low temperature and has a simple manufacturing process based on the existing semiconductor process technology.

A conventional OLED display device uses a microcavity technology in order to improve the color purity and the brightness. The microcavity technology is an optical technology using an effect that pieces of light emitted from an emission layer interfere with each other between the cathode and the anode.

However, the OLED display device using the microcavity technology has an improved color purity and luminous efficiency of red and green, but has very low luminous efficiency of blue.

SUMMARY

An aspect of this document is to provide an OLED display device which is capable of improving the color purity and efficiency of red, green, and blue and also improving a viewing angle characteristic by selectively forming a translucent reflection layer in each of two or less of red, green, and blue subpixels.

An OLED display device according to an embodiment of this document may comprise a substrate and a number of unit pixels placed over the substrate. Each of the unit pixels comprises emission layers each interposed between first electrodes and a second electrode. The unit pixel further comprises three subpixels emitting respective pieces of light of red, green, and blue. Each of two or less of the three subpixels may comprise a translucent reflection layer.

BRIEF DESCRIPTION OF THE DRAWINGS

The accompany drawings, which are included to provide a further understanding of this document and are incorporated on and constitute a part of this specification illustrate embodiments of this document and together with the description serve to explain the principles of this document.

DETAILED DESCRIPTION

Reference will now be made in detail embodiments of the invention examples of which are illustrated in the accompanying drawings.

An OLED display device according to an embodiment of this document comprises a substrate and a number of unit pixels placed over the substrate. Each of the unit pixels comprises emission layers each interposed between first electrodes and a second electrode. The unit pixel further comprises three subpixels emitting respective pieces of light of red, green, and blue. Each of two or less of the three subpixels may comprise a translucent reflection layer.

The translucent reflection layer may be sandwiched between the first electrodes.

The translucent reflection layer may comprise at least one selected from a group consisting of aluminum (Al), silver (Ag), gold (Au), magnesium (Mg), calcium (Ca), or an alloy thereof.

The translucent reflection layer may substantially have a thickness of 1 to 50 nm.

Each of the subpixels may further comprise a common layer comprising a hole injection layer, a hole transport layer, and a multi-layer thereof.

The translucent reflection layer may be formed in each of the subpixels emitting the pieces of light of red and green.

The translucent reflection layer may be formed in the subpixel emitting the light of blue.

The common layer may substantially have a thickness of 500 to 700.

The common layer may substantially have a thickness of 1000 to 1200.

The first electrodes placed in the three subpixels emitting the respective pieces of red, green, and blue may have the same thickness.

Hereinafter, one or more embodiments of this document are described with reference to the accompanying drawings.

Figure 1:
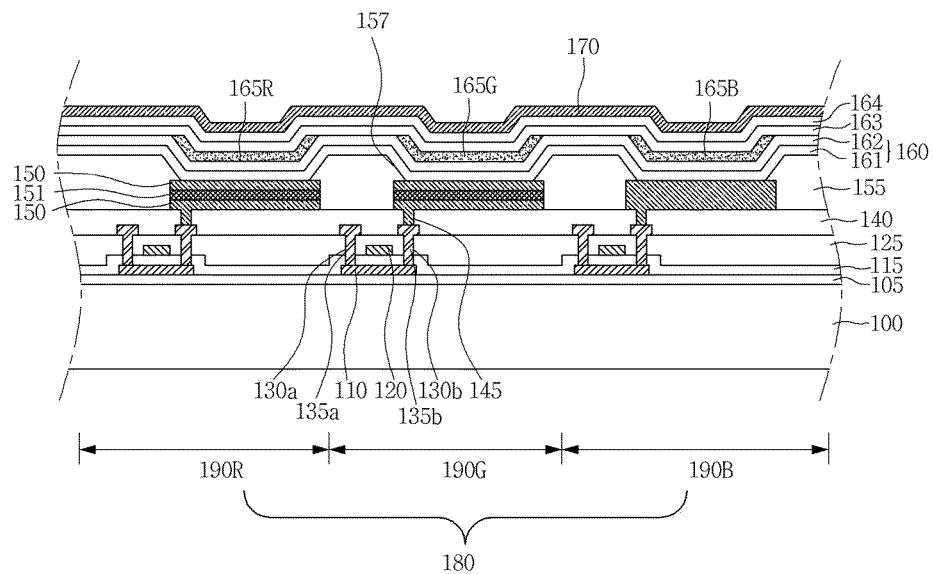
FIG. 1 is a diagram showing an OLED display device according to an embodiment of this document.

FIG. 1 is a diagram showing an OLED display device according to an embodiment of this document.

Referring to FIG. 1, the OLED display device according to the embodiment of this document comprises a substrate 100 and a number of unit pixels 180 placed over the substrate 100. Each of the unit pixels 180 comprises emission layers 165R, 165G, and 165B interposed between first electrodes 150 and a second electrode 170. The unit pixel 180 further comprises three subpixels 190R, 190G, and 190B respectively emitting pieces of light of red, green, and blue. Each of two or less of the three subpixels may comprise a translucent reflection layer 151.

In more detail, a buffer layer 105 is placed on the substrate 100 made of glass, plastic, or metal. The buffer layer 105 functions to protect a thin film transistor (TFT), formed in subsequent processes, from impurities such as alkali ions drained from the substrate 100. The buffer layer 105 may be made of silicon oxide ($SiO_2$) or silicon nitride (SiNx).

A semiconductor layer 110 is placed on the buffer layer 105. The semiconductor layer 110 may be made of crystallized amorphous silicon. A gate insulating layer 115 is placed on the semiconductor layer 110 and is configured to cover the semiconductor layer 110. The gate insulating layer 115 may be formed of a silicon oxide layer, a silicon nitride layer, or a dual layer of them.

A gate electrode 120 is placed on the gate insulating layer 115 and is configured to correspond to a specific region of the semiconductor layer 110. The gate electrode 120 may be made of at least one selected from the group consisting of molybdenum (Mo), aluminum (Al), chromium (Cr), gold (Au), titanium (Ti), nickel (Ni), and copper (Cu), or an alloy thereof. A dielectric interlayer 125 is placed on the gate electrode 120 and is configured to cover the gate electrode 120. The dielectric interlayer 125 may be made of the same material as the gate insulating layer 115 and may be made of, for example, a silicon oxide layer, a silicon nitride layer, or a dual layer of them.

A source electrode 135a and a drain electrode 135b are placed on the dielectric interlayer 125. The source electrode 135a and the drain electrode 135b may be coupled to the semiconductor layer 110 through respective contact holes 130a and 130b which penetrate the gate insulating layer 115 and the dielectric interlayer 125. The source electrode 135a and the drain electrode 135b may be made of Mo, Al, Cr, Au, Ti, Ni, or Cu.

In the embodiment of this document, although the TFT is illustrated to be a top gate-type TFT having the gate electrode placed over the semiconductor layer, the TFT may be a bottom gate-type TFT having the gate electrode placed under the semiconductor layer.

A passivation layer 140 is placed on the source electrode 135a and the drain electrode 135b. The passivation layer 140 may be made of a silicon oxide layer, a silicon nitride layer, or a multi-layer thereof.

The first electrodes 150 are placed over the passivation layer 140. The first electrodes 150 may be formed of a transparent conductive layer, such as indium tin oxide (ITO) or indium zinc oxide (IZO). In some embodiments of this document, the first electrodes 150 may be formed in a pattern shape on each of the subpixels 190R, 190G, and 190B over the substrate 100. In particular, the first electrodes 150 may further comprise the translucent reflection layer 151 in each of the subpixels 190R and 190G which emit respective pieces of light of red and green.

The translucent reflection layer 151 may be formed in a sandwich form within the first electrodes 150. For example, the translucent reflection layer 151 may be interposed between transparent conductive layers (i.e., the first electrodes 150). The translucent reflection layer 151 may comprise Al, Ag, Au, Mg, Ca, or an alloy thereof. Further, the translucent reflection layer 151 may substantially have a thickness of about 1 to 50 nm. Here, if the thickness of the translucent reflection layer 151 is 1 nm or more, there is an advantage in that the translucent reflection layer 151 can have the microcavity effect because it can reflect some of light emitted from the emission layer. If the thickness of the translucent reflection layer 151 is substantially 50 nm or less, there is an advantage in that the translucent reflection layer 151 can prevent a disadvantage in which light emitted from the emission layer is not output to the substrate 100 because the light is totally reflected from the translucent reflection layer 151.

Meanwhile, the translucent reflection layer 151 may not be placed in the blue subpixel 190B, and the first electrodes 150 placed in the respective subpixels 190R, 190G, and 190B may have the same thickness.

A bank layer 155 is placed on the first electrodes 150 in order to insulate neighboring first electrodes from each other. The bank layer 155 may be made of organic matter, such as polyimide, benzocyclobutene series resin, or acrylate. An opening portion 157 exposing the first electrode 150 may be placed in the bank layer 155.

Further, a common layer 160 may be placed over the substrate 100 including the bank layer 155. The common layer 160 may comprise a hole injection layer 161 or a hole transport layer 162 or both. The common layer 160 may have the same thickness in each of the subpixels 190R, 190G, and 190B and may have a thickness of 500 to 700.

The hole injection layer 161 may function to make smooth the injection of holes from the first electrode to the emission layer. The hole injection layer 161 may be made of at least one selected from the group consisting of CuPc (cupper phthalocyanine), PEDOT (poly(3,4)-ethylenedioxythiophene), PANI (polyaniline), and NPD (N,N-dinaphthyl-N,N'-diphenyl benzidine), but not limited thereto.

The hole transport layer 162 may function to make smooth the transport of holes. The hole transport layer 162 may be made of at least one selected from the group consisting of NPD (N,N-dinaphthyl-N,N'-diphenyl benzidine), TPD (N,N'-bis-(3-methylphenyl)-N,N'-bis-(phenyl)-benzidine), s-TAD and MTDATA (4,4',4"-Tris(N-3-methylphenyl-N-phenyl-amino)-triphenylamine).

The red emission layer 165R, the green emission layer 165G, and the blue emission layer 165B are placed in the respective subpixels 190R, 190G, and 190B on the common layer 160.

The red emission layer 165R may be made of a phosphorescent material which comprises a host material comprising CBP (carbazole biphenyl) or mCP(1,3-bis(carbazol-9-yl) and a dopant comprising at least one selected from the group consisting of PIQIr(acac)(bis(1-phenylisoquinoline)acetylacetonate iridium), PQIr(acac)(bis(1-phenylquinoline) acetylacetonate iridium), PQIr(tris(1-phenylquinoline)iridium), and PtOEP(octaethylporphyrin platinum). Alternatively, the red emission layer 165R may be made of a fluorescent material comprising PBD:$Eu(DBM)_3$(Phen) or Perylene, but not limited thereto.

The green emission layer 165G may be made of a phosphorescent material which comprises a host material comprising CBP or mCP and a dopant material comprising Ir(ppy)3(fac tris(2-phenylpyridine)iridium). Alternatively, the green emission layer 165G may be made of a fluorescent material comprising Alq3(tris(8-hydroxyquinolino)aluminum, but not limited thereto.

The blue emission layer 165B may be made of a phosphorescent material which comprises a host material comprising CBP or mCP and a dopant material comprising $(4,6-F_2ppy)_2$Irpic. Alternatively, the blue emission layer 165B may be made of a fluorescent material comprising at least one selected from the group consisting of spiro-DPVBi, spiro-6P, distyryl benzene (DSB), distyrylarylene (DSA), PFO series polymer, and PPV series polymer, but not limited thereto.

An electron transport layer 163 and an electron injection layer 164 are placed over each of the emission layers 165R, 165G, and 165B. The electron transport layer 163 functions to make smooth the transport of electrons, and it may be made of at least one selected from the group consisting of Alq3(tris (8-hydroxyquinolino)aluminum), PBD, TAZ, Spiro-PBD, BAlq, and SAlq, but not limited thereto. The electron injection layer 164 functions to make smooth the injection of electrons, and it may be made of at least one selected from the group consisting of LiF, Li, Ba, and $BaF_2$, but not limited thereto.

The second electrode 170 is placed on the electron injection layer 164. The second electrode 170 may be made of metal having a low work function, such as Ag, Mg, or Ca, and it may have a thickness enough to reflect light, emitted from the emission layer, toward the first electrodes 150.

As described above, in the OLED display device according to the first embodiment of this document, the common layer interposed between the first electrode and the emission layer in each subpixel has the same thickness, and the translucent reflection layer is formed only in each of the red and green subpixels.

In general, in order to employ the microcavity effect, subpixels are formed in different thicknesses according to the color characteristics of red, green, and blue. In other words, the common layer, such as the hole injection layer or the hole transport layer interposed between the first electrode and the emission layer, has a different thickness. In such as an OLED display device, however, the color purity and the luminous efficiency of red and green are improved, but the luminous efficiency of blue is low.]

Accordingly, in the embodiment of this document, the subpixels are formed to have the same thickness, but the translucent reflection layer is not formed in the blue subpixel in order to prevent a reduction in the luminous efficiency of blue. Thus, there is an advantage in that both the color purity and the luminous efficiency of red, green, and blue can be improved.

Figure 2:
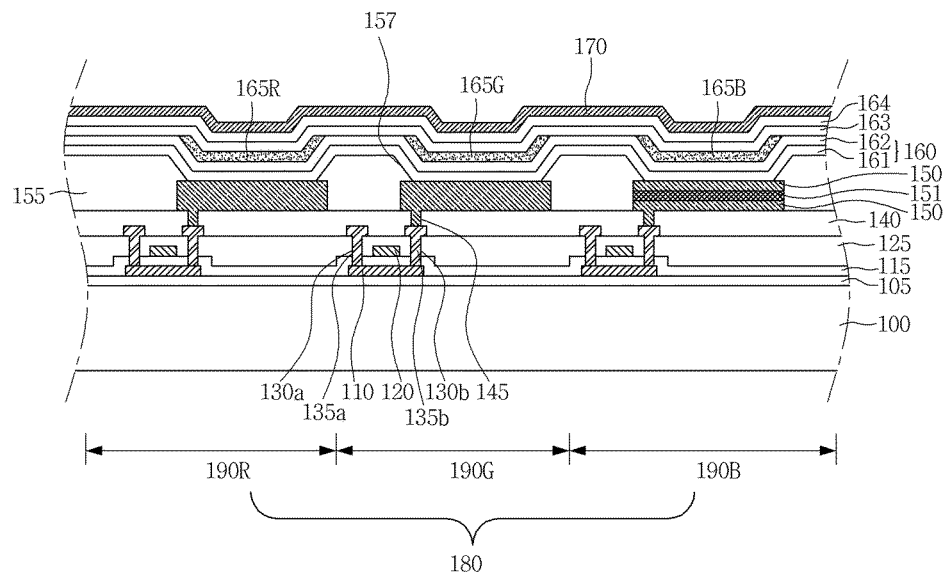
FIG. 2 is a diagram showing an OLED display device according to another embodiment of this document.

FIG. 2 is a diagram showing an OLED display device according to another embodiment of this document.

Unlike in the previous embodiment, in another embodiment shown in FIG. 2, the translucent reflection layer 151 may not be formed in the red and green subpixels 190R and 190G, but may be formed only in the blue subpixel 190B.

Further, unlike the previous embodiment, the common layer 160 interposed between the first electrode 150 and each of the emission layers 165R, 165G, and 165B may substantially have a thickness of 1000 to 1200.

The OLED display device according to another embodiment of this document is illustrated to comprise the translucent reflection layer 151 only in the blue subpixel 190B. The reason why the thickness of the common layer 160 can be increased up to 1000 to 1200 unlike the previous embodiment is described below.

Figure 3:
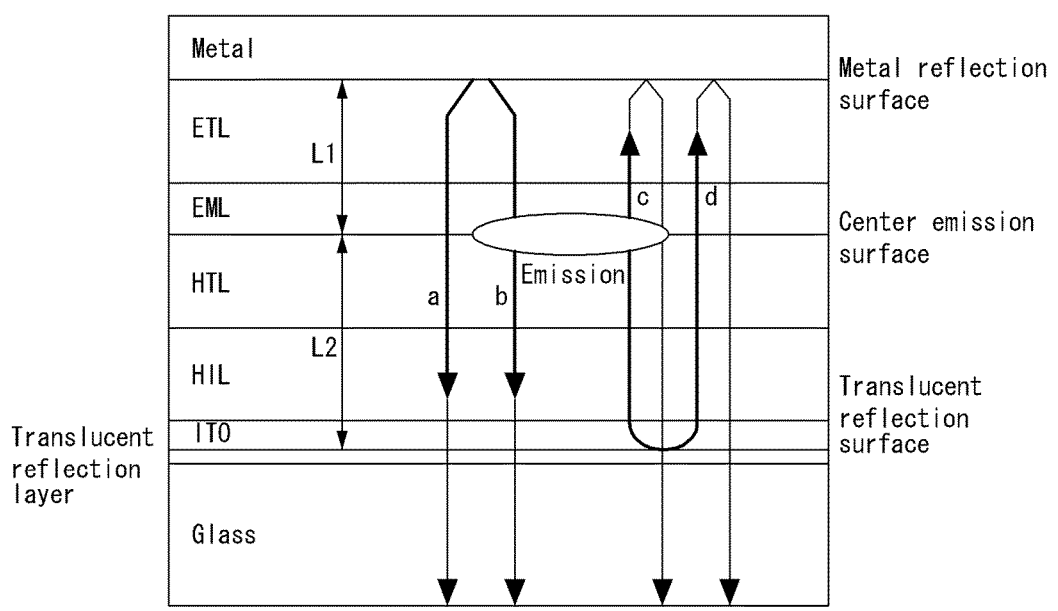
FIG. 3 is a diagram showing an internal light interference phenomenon of an OLED display device.

FIG. 3 is a diagram showing an internal light interference phenomenon of an OLED display device.

Referring to FIG. 3, light emitted from an emission layer EML can be output along a total of three paths. First, there may be pieces of light "a" and "c" which is emitted from the emission layer EML, reflected from a second electrode Metal on the upper side, and then output to a substrate Glass. Second, there may be light "b" which is directly output from the emission layer EML to the substrate Glass. Third, there may be light "d" which is emitted from the emission layer EML, reflected from the second electrode Metal on the upper side, reflected from a translucent reflection layer on the lower side, output to an upper side again, reflected from the second electrode Metal again, and then output to the substrate Glass.

In particular, in the case where the light "b" and the light "a", "c", and "d" have the same wavelength curve, there may be a reinforcement effect (i.e., the microcavity effect). Such microcavity can be expressed using the following equation.

$$2nd=(m+\tfrac{1}{2})/\lambda \qquad \text{[Equation 1]}$$

where "n" denotes the refractive index of the emission layer, "d" denotes the distance between the emission layer and the translucent reflection layer, and λ denotes the wavelength of light (m=1).

When calculating the thickness "d" of the common layer 160 in accordance with Equation 1, the thickness 1000 to 1200 can be calculated in an optimal range which can have the microcavity effect.

As described above, the OLED display device according to another embodiment of this document is advantageous in that it can improve the luminous efficiency of blue because it selectively includes the translucent reflection layer only in the blue subpixel.

Hereinafter, in order to help understanding of this document, some embodiments are disclosed. It is to be noted that the disclosed embodiments are only illustrative and this document is not limited to the following embodiments.

Experiment 1: Measurement of Luminous Efficiency According to Thickness of Common Layer The OLED display device comprising the red, green, and blue subpixels was fabricated over the glass substrate. The red subpixel was formed by stacking ITO (i.e., the first electrode) having a thickness of 100, Ag (i.e., the translucent reflection layer) having a thickness of 200, and ITO (i.e., the first electrode) having a thickness of 100. The hole injection layer was formed using CuPc at a thickness of 50, the hole transport layer was formed using NPD at a thickness of 300, the red emission layer was formed using a mixture of CBP (i.e., a host) and PQIr(acac) (i.e., a dopant) at a thickness of 200, the electron transport layer was formed using $Alq_3$ at a thickness of 200, the electron injection layer was formed using LiF at a thickness of 10, and the second electrode was formed using Al at a thickness of 1000.

The green subpixel was fabricated under the same conductions as the red subpixel except that the green emission layer was formed using a mixture of CBP (i.e., a host) and Ir(ppy3) (i.e., a dopant) at a thickness of 200.

The blue subpixel was fabricated under the same conductions as the red subpixel except that each of the first electrodes was formed using ITO at a thickness of 400 without the translucent reflection layer interposed therebetween, the hole transport layer was formed using NPD at a thickness of 500, and the blue emission layer was formed using a mixture of CBP (i.e., a host) and spiro-DPVBi (i.e., a dopant) at a thickness of 300.

Figure 4A:
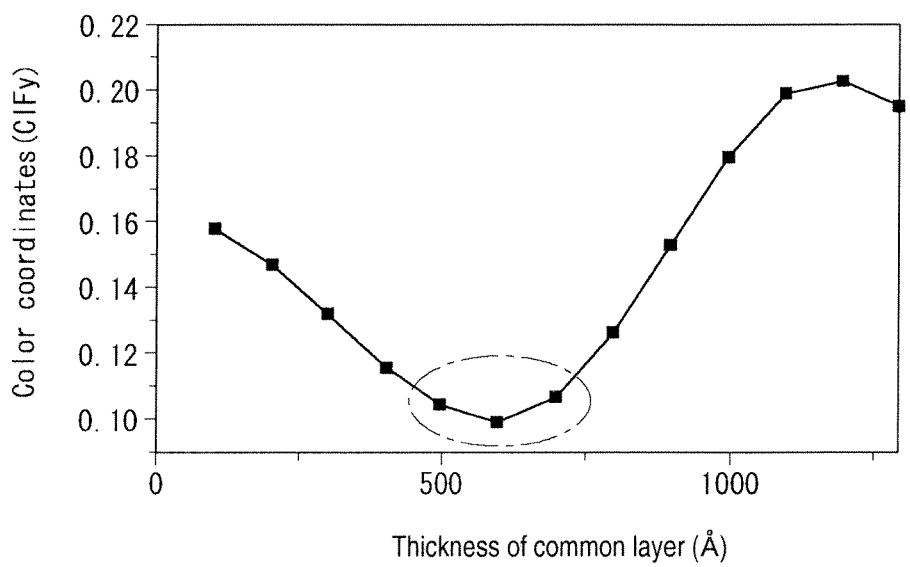
FIGS. 4A to 4C are graphs showing color coordinates according to the thickness of a common layer of red, green, and blue subpixels fabricated in accordance with Experiment 1.
Figure 4B:
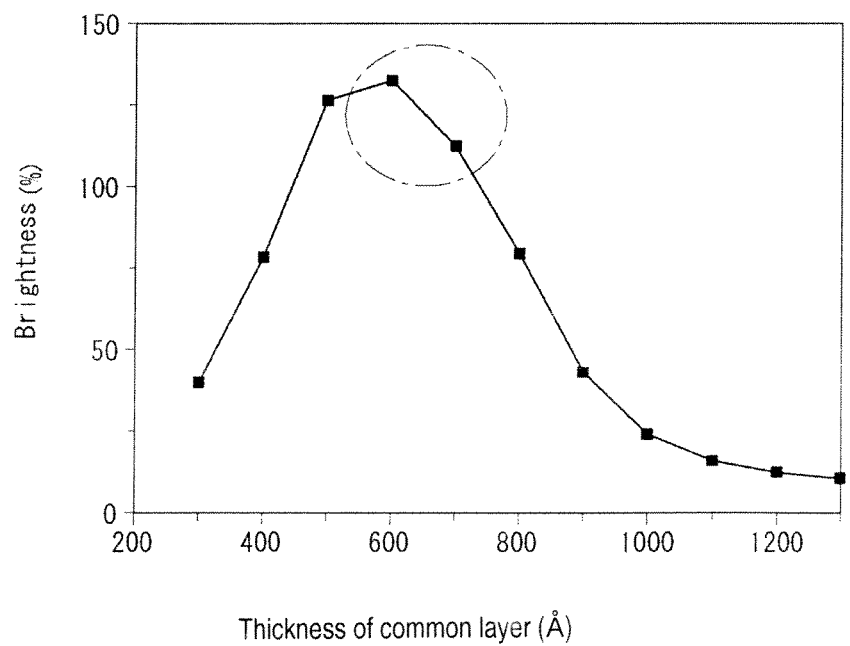
Figure 4C:
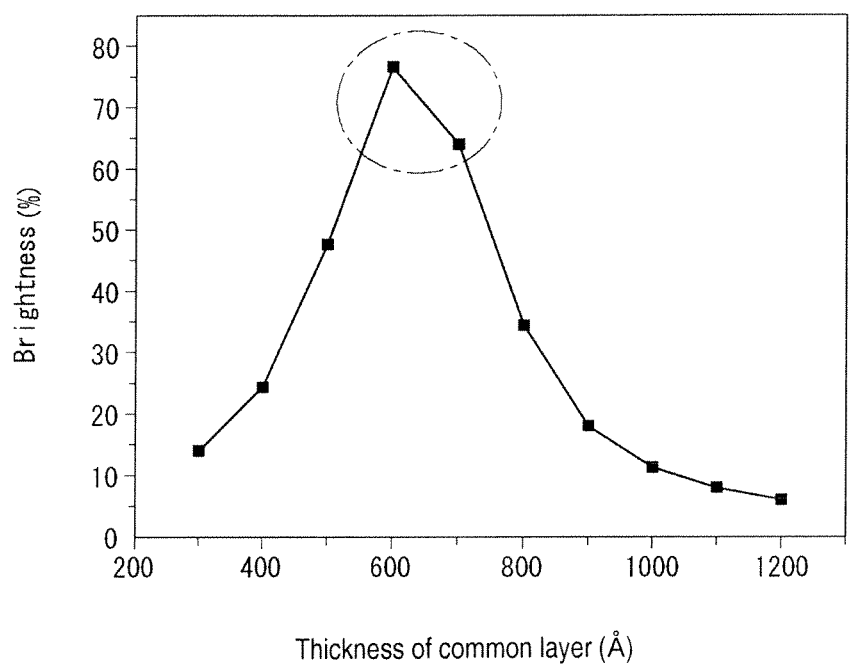

In the OLED display device fabricated as described above, the brightness according to the thickness of the common layer was measured by variously changing the thickness of the hole transport layer of each of the red and green subpixels within a range of about 300 to 1200, and the measurement results are shown in FIGS. 4B and 4C. Further, color coordinates according to the thickness of the common layer were measured by variously changing the thickness of the hole transport layer of the blue subpixel within a range of about 100 to 1300, and the measurement results are shown in FIG. 4A.

From FIG. 4A, it can be seen that the blue subpixel had the best color coordinates when the thickness of the common layer was about 600 nm. Further, from FIGS. 4B and 4C, it can be seen that the red and green subpixels had the best brightness when the thickness of the common layer was about 600 nm.

The above experiment 1 reveals that, in the structure of the OLED display device according to the embodiment of this document (i.e., the structure in which the translucent reflection layer is formed in each of the red and green subpixels, but is not formed in the blue subpixel), the color purity and the luminous efficiency of red, green, and blue are the best when the thickness of the common layer is about 600 nm.

Experiment 2: Measurement of Efficiency and Lifespan of Blue According to Whether Translucent Reflection Layer is Included Embodiment 1

The blue subpixel was fabricated over the glass substrate. The blue subpixel was formed by stacking ITO (i.e., the first electrode) having a thickness of 100, Ag (i.e., the translucent reflection layer) having a thickness of 100, and ITO (i.e., the first electrode) having a thickness of 100. The hole injection layer was formed using CuPc at a thickness of 50, the hole transport layer was formed using NPD at a thickness of 1400, the red emission layer was formed using a mixture of CBP (i.e., a host) and spiro-DPVBi (i.e., a dopant) at a thickness of 300, the electron transport layer was formed using $Alq_3$ at a thickness of 200, the electron injection layer was formed using LiF at a thickness of 10, and the second electrode was formed using Al at a thickness of 1000.

Embodiment 2

The same conditions as Embodiment 1 were used except that the thickness of the translucent reflection layer was set to 200 and the thickness of the hole transport layer was set to 1300.

Embodiment 3

The same conditions as Embodiment 1 were used except that the thickness of ITO was set to 320 without the translucent reflection layer and the thickness of the hole transport layer was set to 700.

Figure 5:
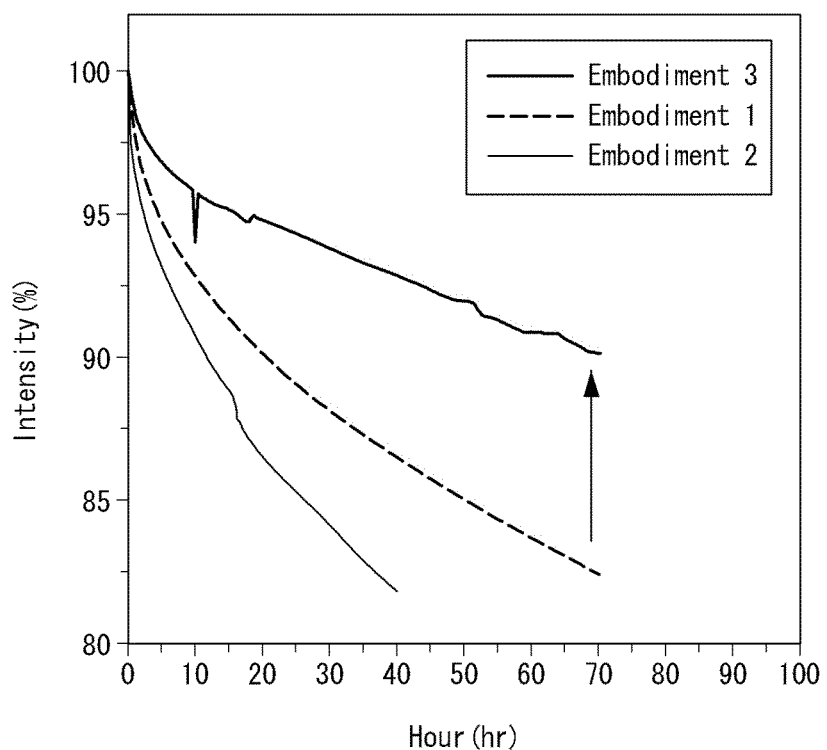
FIG. 5 is a graph showing the lifespan characteristic of a blue subpixel fabricated in accordance with Experiment 2.

The brightness, efficiency, color coordinates, and external quantum efficiency (EQE) of the blue subpixel fabricated according to each of Embodiments 1 to 3 are listed in Table 1 below, and the lifespan characteristic of the blue subpixel fabricated according to each of Embodiments 1 to 3 is shown in FIG. 5.

layer. On the other hand, it can be seen that Embodiment 3 without the translucent reflection layer has excellent brightness, efficiency, and lifespan.

When describing Experiment 2 in connection with Experiment 1, Experiment 2 shows that the color purity and efficiency of the red and green subpixels can be improved because the translucent reflection layer is used, and the color purity and efficiency of the blue subpixel can be improved because the translucent reflection layer is not used.

Experiment 3: Measurement of Viewing Angle According to the Use of Translucent Reflection Layer Embodiment 1

The OLED display device comprising the red, green, and blue subpixels was fabricated over the glass substrate. ITO (i.e., the first electrode) was stacked over the glass substrate at a thickness of 100, Ag (i.e., the translucent reflection layer) was stacked at a thickness of 200, and ITO (i.e., the first electrode) was stacked again at a thickness of 100. The hole injection layer was formed using CuPc at a thickness of 50, and the hole transport layer made of NPD was formed in each of the red, green, and blue subpixels at respective thicknesses of 2100, 1800, and 1300. The red emission layer was formed using a mixture of CBP (i.e., a host) and PQIr(acac) (i.e., a dopant) at a thickness of 450, the green emission layer was formed using a mixture of CBP (i.e., a host) and Ir(ppy3) (i.e., a dopant) at a thickness of 200, the blue emission layer was formed using a mixture of CBP (i.e., a host) and spiro-DPVBi (i.e., a dopant) at a thickness of 300, the electron transport layer was formed using $Alq_3$ at a thickness of 200, the electron injection layer was formed using LiF at a thickness of 10, and the second electrode was formed using Al at a thickness of 1000.

Embodiment 2

The same conditions as Embodiment 1 were used except that, in the red and green subpixels, ITO was formed at a thickness of 320 without the translucent reflection layer and the thickness of the hole transport layer was set to 1100. Further, the blue subpixel was fabricated under the same conditions as Embodiment 1.

Figure 6A:
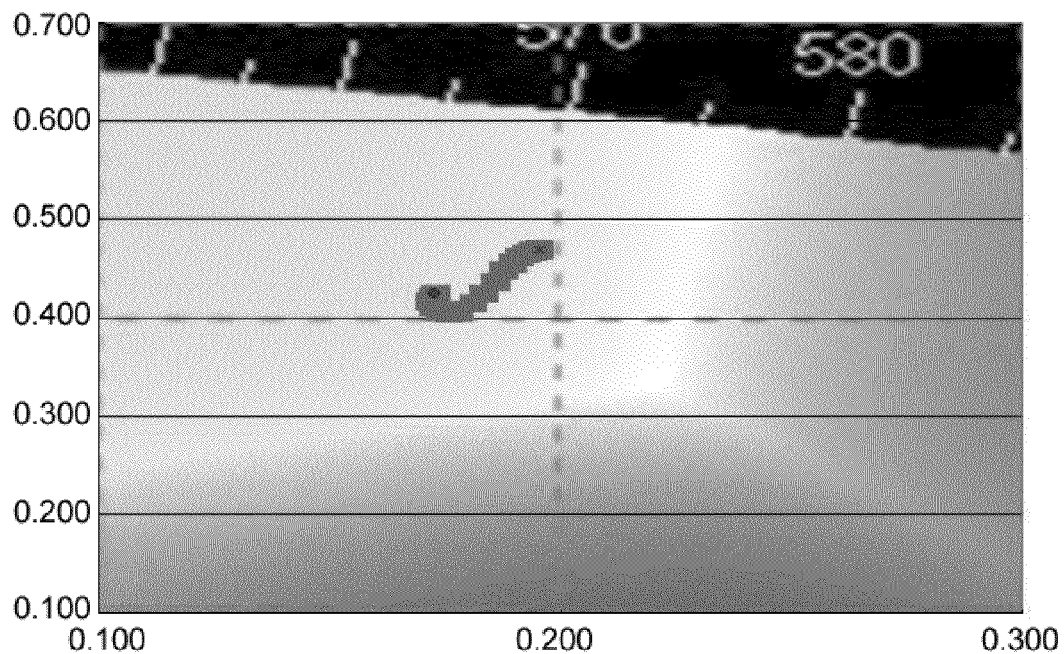
FIGS. 6A and 6B are graphs showing color coordinate movements of white of an OLED display device fabricated in accordance with Experiment 3.
Figure 6B:
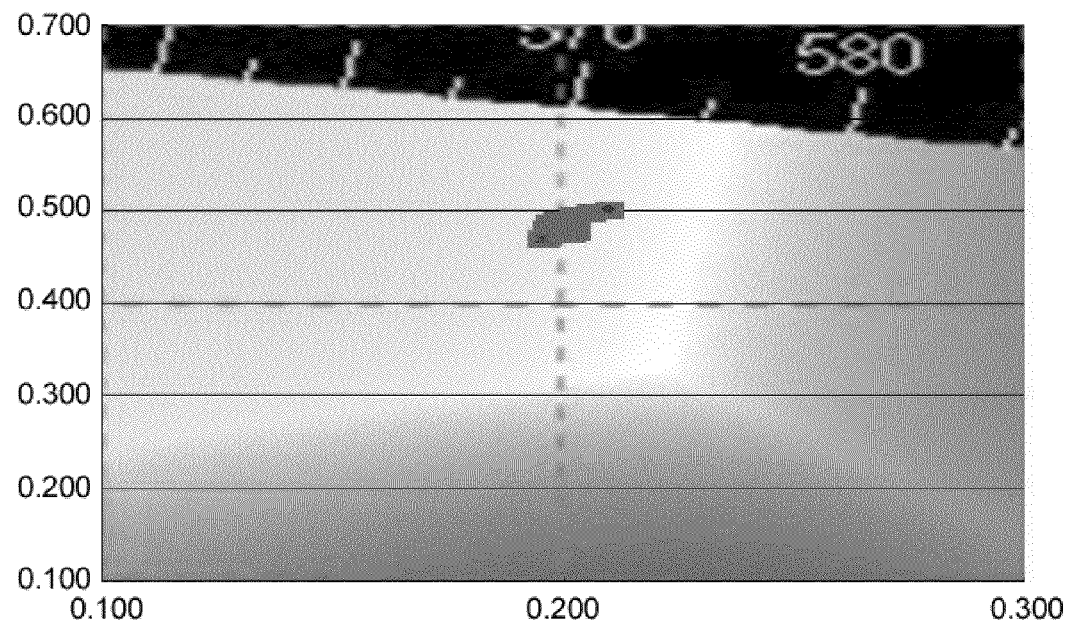
Figure 7A:
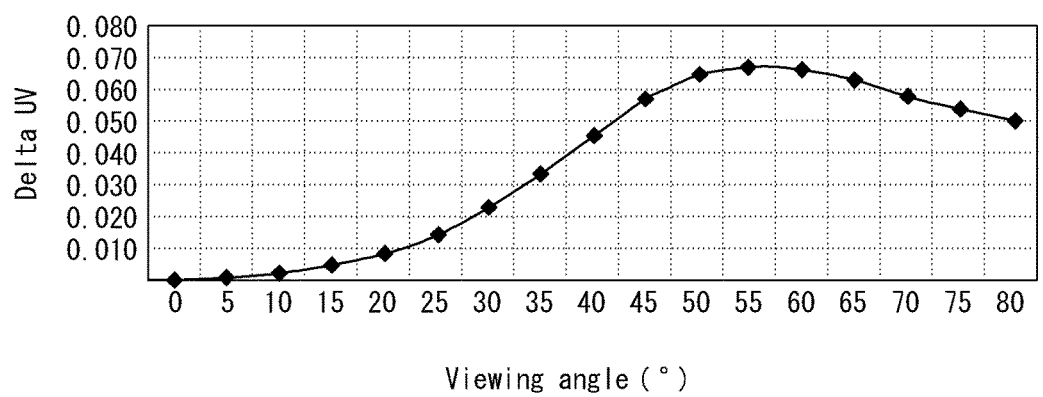
FIGS. 7A and 7B are graphs showing delta UV values according to the viewing angle of the OLED display device fabricated in accordance with Experiment 3.
Figure 7B:
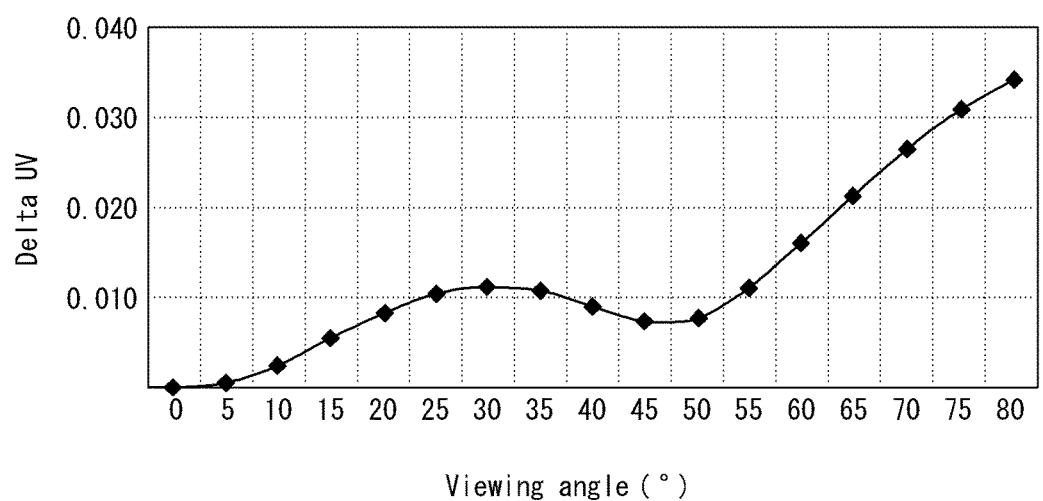

Viewing angle characteristics of the OLED display devices fabricated in accordance with Embodiments 1 and 2 were measured. FIGS. 6A and 6B show the movements of color coordinates of white according to Embodiments 1 and 2, FIGS. 7A and 7B show delta UV values according to the

TABLE 1

| | Structure | | | | | | |
|---|---|---|---|---|---|---|---|
| | Whether translucent reflection layer is included or not (thickness) | Thickness of common layer ( ) | Brightness (cd/a) | Efficiency (lm/w) | Color coordinates (CIE_x) | Color coordinates (CIE_y) | EQE (%) |
| Embodiment 1 | Yes (100) | 1450 | 7.2 | 6.0 | 0.139 | 0.098 | 9.1 |
| Embodiment 2 | Yes (200) | 1350 | 4.9 | 3.9 | 0.143 | 0.059 | 9.3 |
| Embodiment 3 | No | 750 | 8.9 | 7.6 | 0.144 | 0.100 | 10.3 |

Figure 8A:
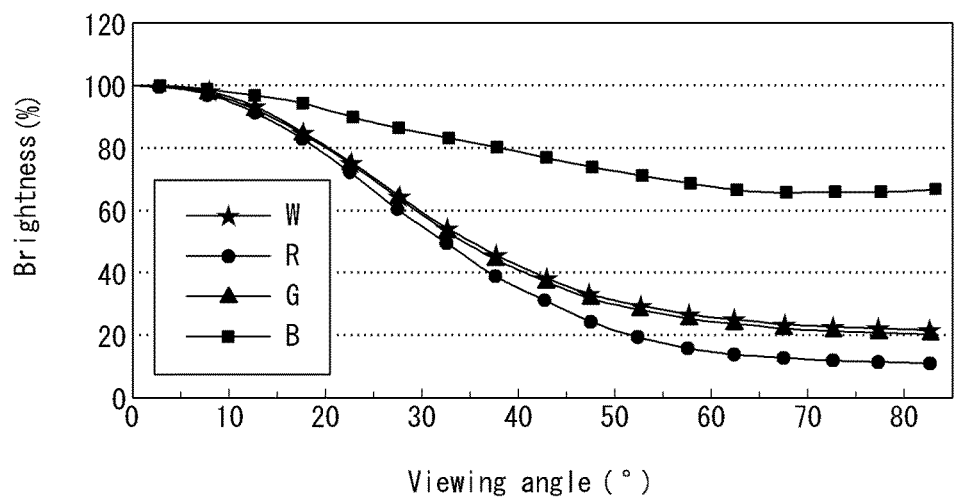
FIGS. 8A and 8B are graphs showing the brightness according to the viewing angle of the OLED display device fabricated in accordance with Experiment 3.
Figure 8B:
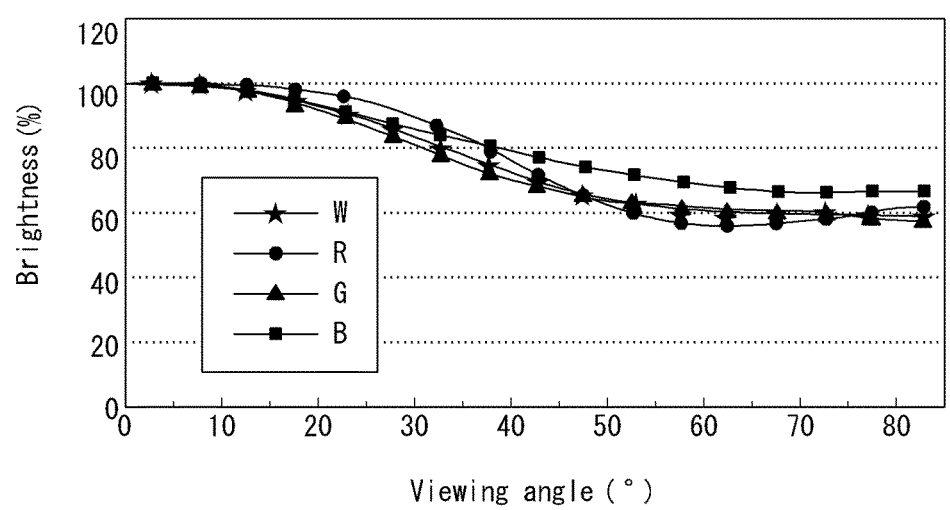

From Table 1 and FIG. 5, it can seen that, in Embodiments 1 and 2, a sense of color is improved due to the microcavity effect according to the use of the translucent reflection layer, but efficiency is low due to the movement of a short wavelength and a reduction in transmissivity and the lifespan is very short due to an increase in the thickness of the common viewing angles of Embodiments 1 and 2, and FIGS. 8A and 8B show brightness according to the viewing angles of Embodiments 1 and 2.

Referring to FIGS. 6A to 8B, it can be seen that Embodiment 2 in which the translucent reflection layer is formed only in the blue subpixel are less in the movement of white color coordinates and are excellent in the delta UV values and brightness characteristic according to the viewing angles, as compared to Embodiment 1 in which the translucent reflection layers are formed in the respective red, green, and blue subpixels.

That is, the OLED display device according to another embodiment of this document is advantageous in that it has an excellent viewing angle characteristic because the translucent reflection layer is formed only in the blue subpixel.

As described above, the OLED display devices according to the embodiments of this document are advantageous in that they can improve the color purity and efficiency of red, green, and blue and also a viewing angle characteristic by selectively forming the translucent reflection layer in each of two or less of the red, green, and blue subpixels.

The foregoing embodiments and advantages are merely exemplary and are not to be construed as limiting this document. The present teaching can be readily applied to other types of apparatuses. The description of the foregoing embodiments is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures. Moreover, unless the term "means" is explicitly recited in a limitation of the claims, such limitation is not intended to be interpreted under 35 USC 112(6).

What is claimed is:

1. An organic light emitting diode (OLED) display device, comprising:
   a substrate; and
   a number of unit pixels placed over the substrate and each configured to comprise emission layers each interposed between first electrodes and a second electrode,
   wherein each of the unit pixels comprise three subpixels emitting respective pieces of light of red, green, and blue, and
   each of two or less of the three subpixels comprises a translucent reflection layer.

2. The OLED display device of claim 1, wherein the translucent reflection layer is sandwiched between the first electrodes.

3. The OLED display device of claim 1, wherein the translucent reflection layer comprises at least one selected from a group consisting of aluminum (Al), silver (Ag), gold (Au), magnesium (Mg), calcium (Ca), or an alloy thereof.

4. The OLED display device of claim 1, wherein the translucent reflection layer substantially has a thickness of 1 to 50 nm.

5. The OLED display device of claim 1, wherein the common layer comprises a hole injection layer, a hole transport layer, and a multi-layer thereof.

6. The OLED display device of claim 5, wherein the translucent reflection layer is formed in each of the subpixels emitting the pieces of light of red and green.

7. The OLED display device of claim 5, wherein the translucent reflection layer is formed in the subpixel emitting the light of blue.

8. The OLED display device of claim 6, wherein the common layer substantially has a thickness of 500 to 700 Å.

9. The OLED display device of claim 7, wherein the common layer substantially has a thickness of 1000 to 1200 Å.

10. The OLED display device of claim 1, wherein the first electrodes placed in the three subpixels emitting the respective pieces of red, green, and blue have a same thickness.

* * * * *